(12) United States Patent
Tong

(10) Patent No.: US 12,068,144 B2
(45) Date of Patent: Aug. 20, 2024

(54) MULTI-STAGE PUMPING LINER

(71) Applicant: Applied Materials, Inc., Santa Clara, CA (US)

(72) Inventor: Mingle Tong, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 427 days.

(21) Appl. No.: 16/932,799

(22) Filed: Jul. 19, 2020

(65) Prior Publication Data

US 2022/0018024 A1 Jan. 20, 2022

(51) Int. Cl.
*H01J 37/32* (2006.01)
*C23C 16/44* (2006.01)
*C23C 16/455* (2006.01)
(Continued)

(52) U.S. Cl.
CPC .... *H01J 37/32834* (2013.01); *C23C 16/4412* (2013.01); *C23C 16/45508* (2013.01);
(Continued)

(58) Field of Classification Search
CPC ........... C23C 16/4412; C23C 16/45502–4551; C23C 16/45563–45568; C23C 16/45578;
(Continued)

(56) References Cited

U.S. PATENT DOCUMENTS 4,807,562 A * 2/1989 Sandys ............. C23C 16/45563
118/728
5,441,568 A * 8/1995 Cho .................... C23C 16/4412
118/728
(Continued)

FOREIGN PATENT DOCUMENTS

| CN | 1918324 A | 2/2007 |
|---|---|---|
| KR | 2009-0117755 A | 11/2009 |
| WO | 2019-212685 A1 | 11/2019 |

OTHER PUBLICATIONS

International Search Report and Written Opinion mailed Nov. 11, 2021 in International Patent Application No. PCT/US2021/041097, 9 pages.
Application No. PCT/US2021/041097 , International Preliminary Report on Patentability, Mailed On Feb. 2, 2023, 8 pages.

*Primary Examiner* — Kurt Sweely

(74) *Attorney, Agent, or Firm* — Kilpatrick Townsend & Stockton LLP

(57) ABSTRACT

Exemplary semiconductor processing systems may include a pumping system, a chamber body that defines a processing region, and a pumping liner disposed within the processing region. The pumping liner may define an annular member characterized by a wall that defines an exhaust aperture coupled to the pumping system. The annular member may be characterized by an inner wall that defines a plurality of apertures distributed circumferentially along the inner wall. A plenum may be defined in the annular member between interior surfaces of the walls. A divider may be disposed within the plenum, where the divider separates the plenum into a first plenum chamber and a second plenum chamber, wherein the first plenum chamber is fluidly accessible from the apertures defined through the inner wall, and wherein the divider defines at least one aperture providing fluid access between the first plenum chamber and the second plenum chamber.

20 Claims, 4 Drawing Sheets

(51) Int. Cl.
*C23C 16/458* (2006.01)
*H01L 21/67* (2006.01)

(52) U.S. Cl.
CPC .... *C23C 16/45591* (2013.01); *C23C 16/4585* (2013.01); *H01J 37/32871* (2013.01); *H01J 37/32091* (2013.01); *H01J 37/32449* (2013.01); *H01J 37/32458* (2013.01); *H01L 21/67167* (2013.01)

(58) Field of Classification Search
CPC .......... C23C 16/45591; C23C 16/4585; H01L 21/67069; H01L 21/67155–67173; H01L 21/6719
See application file for complete search history.

(56) References Cited

U.S. PATENT DOCUMENTS

| | | | |
|---|---|---|---|
| 6,176,969 B1* | 1/2001 | Park | H01J 37/3244 257/E21.252 |
| 7,648,610 B2* | 1/2010 | Komiya | H01J 37/32449 118/715 |
| 8,444,926 B2* | 5/2013 | Fodor | C23C 16/46 156/345.37 |
| 2012/0009765 A1* | 1/2012 | Olgado | C23C 16/45565 257/E21.09 |
| 2018/0337027 A1* | 11/2018 | L'Heureux | B01D 53/32 |
| 2020/0216952 A1 | 7/2020 | Ghosh et al. | |

* cited by examiner

MULTI-STAGE PUMPING LINER

TECHNICAL FIELD

The present technology relates to components and apparatuses for semiconductor manufacturing. More specifically, the present technology relates to processing chamber distribution components and other semiconductor processing equipment.

BACKGROUND

Integrated circuits are made possible by processes which produce intricately patterned material layers on substrate surfaces. Producing patterned material on a substrate requires controlled methods for forming and removing material. Chamber components often deliver processing gases to a substrate for depositing films or removing materials. These gases and other byproducts within the chamber are removed, but removal may cause residual particles to fall on the patterned substrates. For example, the flow pattern of gases and byproducts during exhaust may result in non-uniform material formation on the substrate. Additionally, uneven flow patterns of the gases and byproducts through the processing chamber may result in buildup on the exhaust components of the processing chamber.

Thus, there is a need for improved systems and methods that can be used to produce high-quality devices and structures. These and other needs are addressed by the present technology.

SUMMARY

Exemplary semiconductor processing chamber pumping liners may include an annular housing. The annular housing may include an inner wall defining an inner surface of the annular housing. The inner wall may define a plurality of pumping apertures through the inner wall and disposed along the inner wall of the annular housing. The annular housing may include a lower wall defining a lower surface of the annular housing. The lower wall may define a main pumping aperture through the lower wall. The annular housing may include a first annular plenum chamber disposed along an inner surface of the inner wall. The annular housing may include a second annular plenum chamber disposed along an inner surface of the lower wall. The annular housing may include a plenum barrier separating the first annular plenum chamber and the second annular plenum chamber. The plenum barrier may define a plurality of interior apertures through the plenum barrier.

In some embodiments, each of the plurality of pumping apertures may be equally sized and/or may be disposed equidistantly along the inner wall of the annular housing. The main pumping aperture may be vertically offset from each aperture of the plurality of interior apertures. The plurality of interior apertures may be equally sized and/or may be disposed equidistantly about the plenum barrier. A first aperture of the plurality of interior apertures may be larger than a second aperture of the plurality of interior apertures, and/or an angular offset between apertures of the plurality of interior apertures may vary between apertures of the plurality of interior apertures. The plurality of pumping apertures may have a diameter of less than or about one-half the diameter of the plurality of interior apertures. The annular housing may include a first structural component including the plenum barrier, a second structural component including the lower wall, and a third structural component including the inner wall, and the third structural component may be seated on a recessed ledge of the first structural component.

Some embodiments of the present technology may encompass semiconductor processing systems. The systems may include a pumping system, a chamber body having sidewall and a bottom wall defining a processing region, and a pumping liner disposed within the processing region along the sidewall of the chamber body. The pumping liner may define an annular member characterized by a first wall and a second wall opposite the first wall. The second wall may define an exhaust aperture extending through the second wall and coupled to the pumping system. The annular member may be characterized by an inner wall defining an inner annular radius of the annular member along an exterior surface of the inner wall. The inner wall may define a plurality of apertures distributed circumferentially along the inner wall of the annular member. The annular member may be characterized by an outer wall defining an outer annular radius of the annular member along an exterior surface of the outer wall. A plenum may be defined in the annular member between interior surfaces of the first wall, the second wall, the inner wall, and the outer wall. The annular member may be characterized by a divider disposed within the plenum and extending from the outer wall to the second wall. The divider may separate the plenum into a first plenum chamber and a second plenum chamber. The first plenum chamber may be at least partially defined by interior surfaces of the inner wall and the first wall. The first plenum chamber may be fluidly accessible from the plurality of apertures defined through the inner wall. The divider may define at least one aperture providing fluid access between the first plenum chamber and the second plenum chamber.

In some embodiments, the plurality of apertures distributed circumferentially along the inner wall of the annular member may be equally sized and/or may be distributed equidistantly. The exhaust aperture may be vertically offset from the at least one aperture providing fluid access between the first plenum chamber and the second plenum chamber. The at least one aperture providing fluid access between the first plenum chamber and the second plenum chamber may include more than one aperture that are equally-sized and/or that are disposed equidistantly about the divider. A first aperture of the at least one aperture providing fluid access between the first plenum chamber and the second plenum chamber may be larger than a second aperture of the at least one aperture providing fluid access between the first plenum chamber and the second plenum chamber and/or an angular offset between apertures of the at least one aperture providing fluid access between the first plenum chamber and the second plenum chamber may vary between apertures of the at least one aperture providing fluid access between the first plenum chamber and the second plenum chamber. The plurality of apertures distributed circumferentially along the inner wall of the annular member may have a diameter of less than or about one-half the diameter of the at least one aperture providing fluid access between the first plenum chamber and the second plenum chamber. The annular member may include a first structural component including the divider, a second structural component including the second wall, and a third structural component including the inner wall. The third structural component may be seated on a recessed ledge of the first structural component.

Some embodiments of the present technology may encompass semiconductor processing chamber pumping liners. The pumping liner may include an annular member. The annular member may be characterized by a first wall and a second wall opposite the first wall. The second wall may define an exhaust aperture extending through the second wall. The annular member may be characterized by an inner wall defining an inner annular radius of the annular member along an exterior surface of the inner wall. The inner wall may define a plurality of apertures distributed circumferentially along the inner wall of the annular member. The annular member may be characterized by an outer wall defining an outer annular radius of the annular member along an exterior surface of the outer wall. A plenum may be defined in the annular member between interior surfaces of the first wall, the second wall, the inner wall, and the outer wall. The annular member may be characterized by a divider disposed within the plenum and extending from the outer wall to the second wall. The divider may separate the plenum into a first plenum chamber and a second plenum chamber. The first plenum chamber may be at least partially defined by interior surfaces of the inner wall and the first wall. The first plenum chamber may be fluidly accessible from the plurality of apertures defined through the inner wall. The divider may define at least one aperture providing fluid access between the first plenum chamber and the second plenum chamber.

In some embodiments, the exhaust aperture may be vertically offset from the at least one aperture providing fluid access between the first plenum chamber and the second plenum chamber. The at least one aperture providing fluid access between the first plenum chamber and the second plenum chamber may include more than one aperture that may be equally-sized and/or that may be disposed equidistantly about the divider. A first aperture of the at least one aperture providing fluid access between the first plenum chamber and the second plenum chamber may be larger than a second aperture of the at least one aperture providing fluid access between the first plenum chamber and the second plenum chamber and/or an angular offset between apertures of the at least one aperture providing fluid access between the first plenum chamber and the second plenum chamber may vary between apertures of the at least one aperture providing fluid access between the first plenum chamber and the second plenum chamber. The plurality of apertures distributed circumferentially along the inner wall of the annular member may have a diameter of less than or about one-half the diameter of the at least one aperture providing fluid access between the first plenum chamber and the second plenum chamber. The annular member may include a first structural component including the divider, a second structural component including the second wall, and a third structural component including the inner wall. The third structural component may be seated on a recessed ledge of the first structural component.

Such technology may provide numerous benefits over conventional systems and techniques. For example, embodiments of the present technology may reduce buildup of byproducts on exhaust systems within the processing chamber and may provide more even flow patterns of gases and byproducts in the processing chamber during exhaust. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
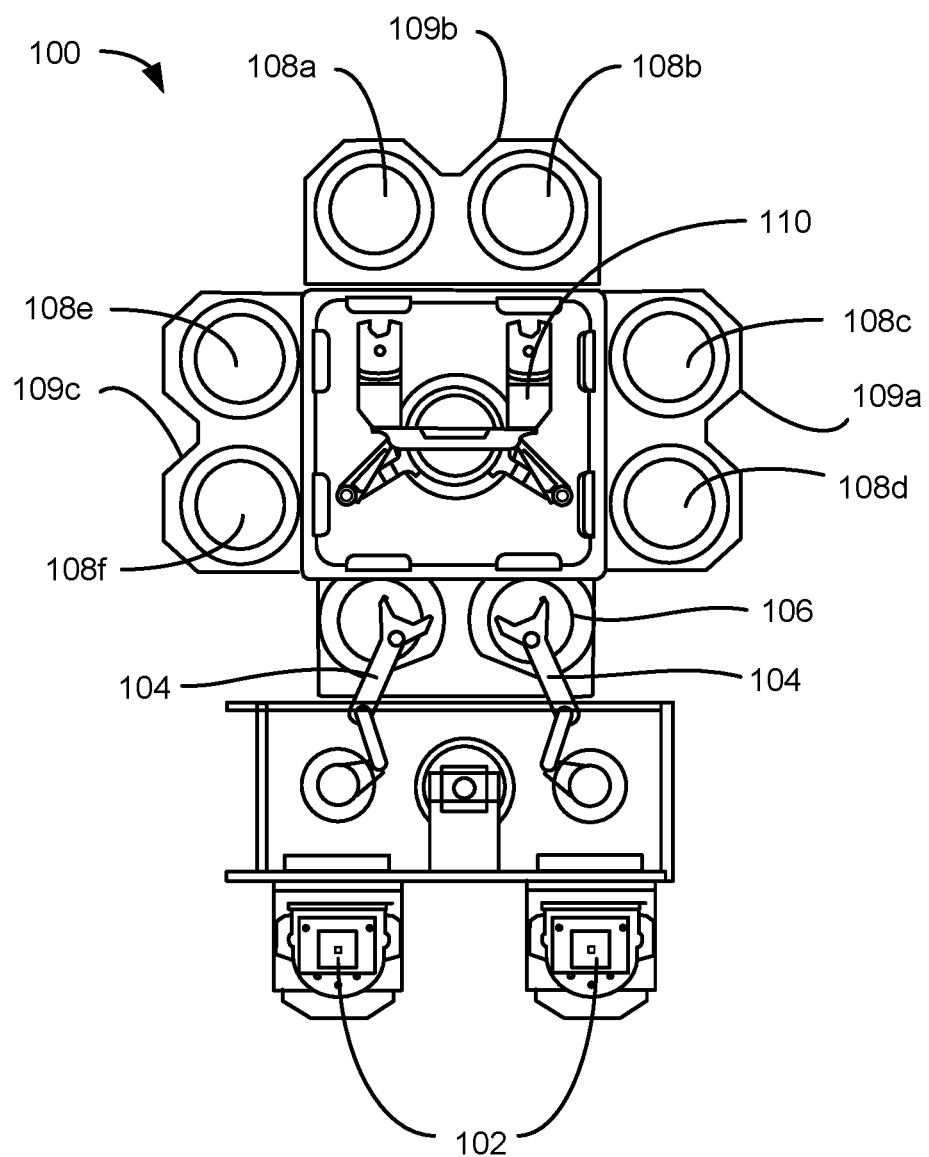
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. In many processing chambers, a gas panel may be used to deliver gases to a processing region of a chamber for developing the structures on the substrate. Further, gases may be delivered to the processing chamber for cleaning operations. Accordingly, in some cases, a substrate may be disposed within the processing region, and the gases may be used to facilitate the patterning of the substrate. In some cases, the processing region may not include a substrate, and the gases may be used to clean the chamber of unwanted byproducts. The gases may be distributed through one or more components within the chamber, which may produce a radial or lateral distribution of delivery to provide increased formation or removal at the substrate surface or within the chamber.

As device features reduce in size, tolerances across a substrate surface may be reduced, and material property differences across a film may affect device realization and uniformity. Temperature differences, flow pattern uniformity, and other aspects of processing may impact the films on the substrate, creating film uniformity differences across the substrate for materials produced or removed. For example, one or more devices may be included within a processing chamber for delivering and distributing gases within the processing chamber. To remove gases and other byproducts within the chamber, a pumping system coupled with the chamber may pump the gases and other byproducts out of the chamber through a pumping liner assembly. Because many pumping systems exhaust from a single location within the chamber, the flow pattern to remove the gasses and byproducts may be uneven (e.g., the flow may be disproportionate near the pumping system), which may impact the uniformity across the substrate. Additionally, buildup may occur on portions of the pumping liner assembly in areas with higher flow than others.

In some non-limiting examples of processes, the pumping liner assembly may include a plenum, fluidly accessible from the processing chamber via apertures in the pumping liner assembly. The apertures and plenum encourage more even flow patterns within the processing chamber for removal of the gases and byproducts through a main exhaust aperture of the pumping liner that is coupled to the pumping system. While these apertures and plenum help even the flow pattern, the flow pattern may still have a substantial impact on buildup of byproducts on the apertures and, in some cases, may impact the uniformity of processes enacted on the substrate.

The present technology overcomes these challenges by accommodating non-uniform flow patterns from a processing region of the chamber with improved pumping liners. A modified pumping liner assembly having two plenum chambers may alter the flow pattern through the processing chamber, evening the flow through the apertures to reduce byproduct buildup and improving uniformity on the substrate surface.

Although the remaining disclosure will routinely identify specific processes utilizing the disclosed technology, it will be readily understood that the systems and methods are equally applicable to deposition and cleaning chambers, as well as processes as may occur in the described chambers. Accordingly, the technology should not be considered to be so limited as for use with these specific deposition processes or chambers alone. The disclosure will discuss one possible system and chamber that may include chamber components according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
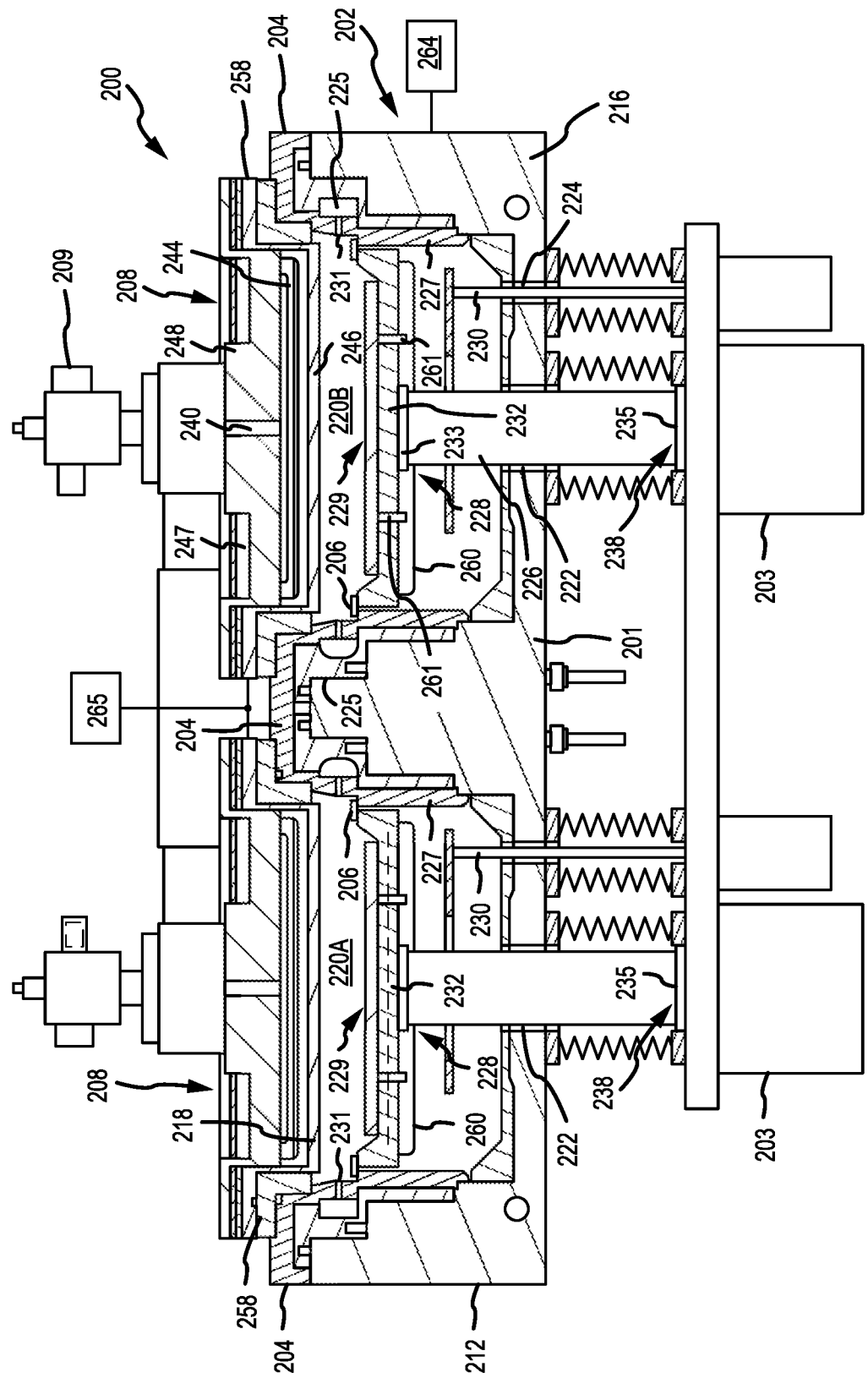
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology, and that may include one or more components according to the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
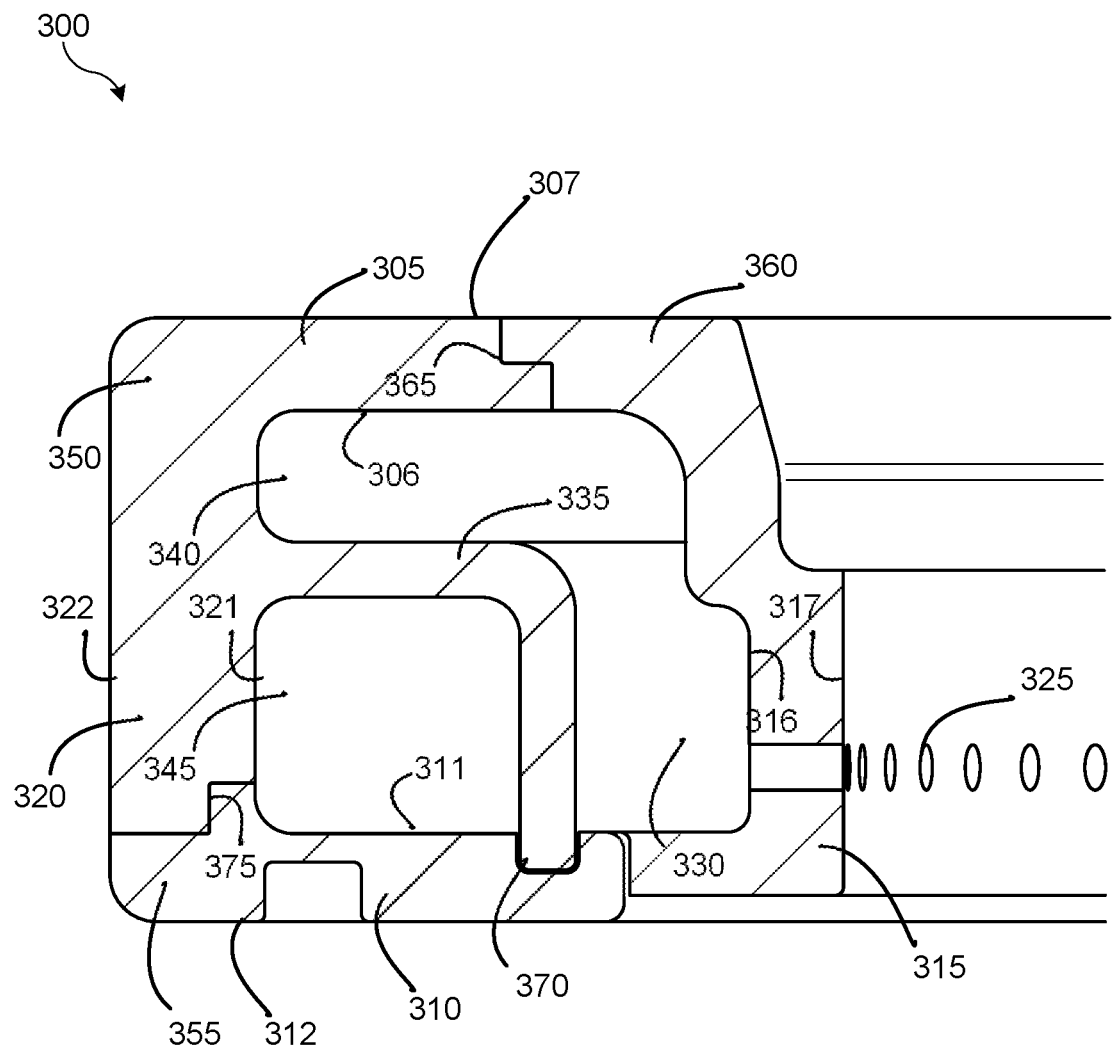
FIG. 3 illustrates a cross-sectional view of an exemplary pumping liner, according to some embodiments of the present technology.

FIG. 3 illustrates a cross-sectional view of an exemplary pumping liner 300, according to some embodiments of the present technology. FIG. 3 may illustrate further details relating to components in system 200, such as for pumping liner assembly 227. The pumping liner 300 is understood to include any feature or aspect of system 200 discussed previously in some embodiments. The pumping liner 300 may be incorporated in chambers used during semiconductor processing operations including deposition, removal, and cleaning operations. The figure may show a partial view of a pumping liner that may be incorporated in a semiconductor processing system, and may illustrate a view across any section of the annular pumping liner 300, which may otherwise be of any size.

As noted, the pumping liner 300 may be included in any number of processing chambers, including system 200 described above. The pumping liner 300 may be included as part of the pumping liner assembly 227. For example, the pumping liner 300 may include pumping cavity 225 and exhaust ports 231 as described further below. The components may include any of the features described previously for similar components, as well as a variety of other modifications similarly encompassed by the present technology.

The pumping liner 300 may be an annular member (i.e., annular housing) and may be positioned within the processing region (e.g., processing region 220) along or in close proximity to the sidewalls (e.g., sidewalls 201, 212) of the chamber body (e.g., chamber body 202) as illustrated previously. The pumping liner 300 may be characterized by a first wall 305 that has an inner surface 306 and an outer surface 307. The pumping liner 300 may be characterized by a second wall 310 opposite the first wall 305. Within a processing chamber, a faceplate or other lid stack components may be seated on first wall 305, while pumping liner 300 may be seated on a lid plate or chamber body on second wall 310. The second wall 310 may have an inner surface 311 and an outer surface 312. The pumping liner 300 may be characterized by an inner wall 315 that defines an inner annular radius (e.g., inner annular radius 405 as described with respect to FIG. 4) of the pumping liner 300. The inner wall 315 has an inner surface 316 and an outer surface 317. The pumping liner 300 may be characterized by an outer wall 320 that defines an outer annular radius (e.g., outer annular radius 410 as described with respect to FIG. 4) of the pumping liner 300. The outer wall 320 has an inner surface 321 and an outer surface 322. In some embodiments, the inner wall 315 may be facing toward the processing region (e.g., processing region 220). For example, in some embodiments, the inner wall 315 may at least partially define the processing region within the chamber. In some embodiments, the second wall 310 may be facing toward the bottom wall (e.g., bottom wall 216) of the processing chamber.

The walls 305, 310, 315, and 320 of the pumping liner 300 may form an annular member (i.e., an annular housing) with the inner surfaces 306, 316, 311, and 321 defining a plenum 330 within the annular member (e.g., a cavity such as circumferential pumping cavity 225). The plenum 330 may be divided by a divider 335 (e.g., a barrier) that separates the plenum 330 into a first plenum chamber 340 and a second plenum chamber 345. The divider 335 may extend from the outer wall 320 to the second wall 310. In some embodiments, the divider 335 may form a ninety-degree (90°) angle, although as illustrated the corner of the arcuate divider may extend along a radius as shown. The first plenum chamber 340 may be defined by a surface of the divider 335, the inner surface 306 of the first wall 305, the inner surface 316 of the inner wall 315, a portion of the inner surface 311 of the second wall 310, and a portion of the inner surface 321 of the outer wall 320. The second plenum chamber 345 may be defined by a second surface of the divider 335, a portion of the inner surface 311 of the second wall 310 and a portion of the inner surface 321 of the outer wall 320. In some embodiments, divider 335 may extend continuously about the annular member within the plenum 330.

In some embodiments, the pumping liner 300 may be characterized by multiple structural components that may be combined to form the annular member and other described features of the pumping liner 300. These structural components may be placed together using recessing features so that the components fit together and remain in place, sealing with or without the use of bonding, welding, or other mechanical coupling. For example, the pumping liner 300 may include a first structural component 350 that may include the outer wall 320, a portion of the first wall 305, and the divider 335. The pumping liner 300 may include a second structural component 355 that may include a portion of the second wall 310. The pumping liner 300 may include a third structural component 360 that may include the inner wall 315, a portion of the first wall 305, and a portion of the second wall 310. The second structural component 355 may define a recessed ledge 375 including an interior step to produce a seating feature against which first component 350 may seat. First component 350 may similarly define a recessed ledge that seats against recessed ledge 375. This contact coupling may limit a gap formed about the liner through which process materials may leak. Additionally, first structural component 350 may be rotatable within the pumping liner, which may adjust apertures as will be discussed below. This may allow a flow control that may affect deposition profiles to account for a planar skew.

Second structural component 355 may also define a channel 370, which may extend about the second structural component, and may be sized to receive first structural component 350. For example, divider 335 may be seated in the channel 370 and an edge of the outer wall 320 may be seated on and against the recessed ledge 375. Further, the first structural component 350 may define a recessed ledge 365 on which the third structural component 360 may be seated. Similarly to recessed ledge 375 and recessed ledge 320, recessed ledge 365 may receive an accommodating recessed ledge of the third structural component as illustrated, which again may limit leakage between the components. The depicted configuration is one, non-limiting example of how the structural components may be seated to form the annular member. In some embodiments, more or fewer structural components may be used and/or the structural components may be seated or coupled differently.

The inner wall 315 may define apertures 325 that extend from the outer surface 317 to the inner surface 316 of the inner wall 315. The apertures 325 may be, for example, exhaust ports 231 described previously. The apertures 325 (pumping apertures or exhaust ports) provide fluid access between the processing region and the first plenum chamber 340. The apertures 325 may be distributed circumferentially along the inner wall 315. There may be any number of apertures 325 defined about the liner, which may impact flow profiles from the processing region. Apertures 325 may be distributed equidistantly from each other, or may be defined about the liner to increase or decrease flow from one or more regions, such as be increasing or decreasing a number of apertures defined in a given region about the liner. In some embodiments, the apertures 325 may be equally sized and may be characterized by a diameter of less than or about 15 mm, less than or about 12 mm, less than or about 10 mm, less than or about 7 mm, less than or about 5 mm, less than or about 3 mm, or less. It is to be understood that apertures 325 may be formed or distributed in other patterns and may be characterized by any size, shape, or azimuthal spacing from one another to promote uniform flow within the processing region or modified distribution.

As will be described in more detail with respect to FIG. 4, divider 335 may define a plurality of apertures (e.g., interior apertures 415) that provide fluid access between the first plenum chamber 340 and the second plenum chamber 345. Also described in more detail with respect to FIG. 4, the second wall 310 may define a main exhaust aperture (e.g., main exhaust aperture 420) that extends from the outer surface 312 to the inner surface 311 of the second wall 310. The main exhaust aperture may be defined in the second structural component 355. The main exhaust aperture may be coupled with a pumping system (e.g., pumping system 264), such that it provides fluid access between the pumping system and the second plenum chamber 345.

In use, the pumping system may include a device to generate a pumping (e.g., suction or vacuum) behavior for exhausting gases and byproducts from the processing region and controlling the pressure within the processing region. The pumping behavior causes gasses and byproducts to flow from the processing region (e.g., processing region 220) through the apertures 325 into the first plenum chamber 340. The gases and byproducts are pulled through the interior apertures (e.g., interior apertures 415) from the first plenum chamber 340 into the second plenum chamber 345. The gases and byproducts are pulled through the main exhaust aperture (e.g., main exhaust aperture 420) from the second plenum chamber 345 into the pumping system (e.g., pumping system 264) to be expelled from the semiconductor processing system. Having a single plenum may cause the gases and byproducts to be drawn at an increased concentration from the processing region at apertures 325 closest to the main exhaust aperture, which may cause flow non-uniformity within the processing region, and which can cause operational skew on the substrate being processed. The use of the divider 335 may equalize and balance the flow pattern of the gases and byproducts in the processing region through each aperture 325 into the first plenum chamber 340. This may occur because the second plenum chamber 345 and interior apertures cause the suction from the pumping system to be more evenly distributed to the first plenum chamber 340 and thus more evenly distributed to the processing region and through the apertures 325.

Figure 4:
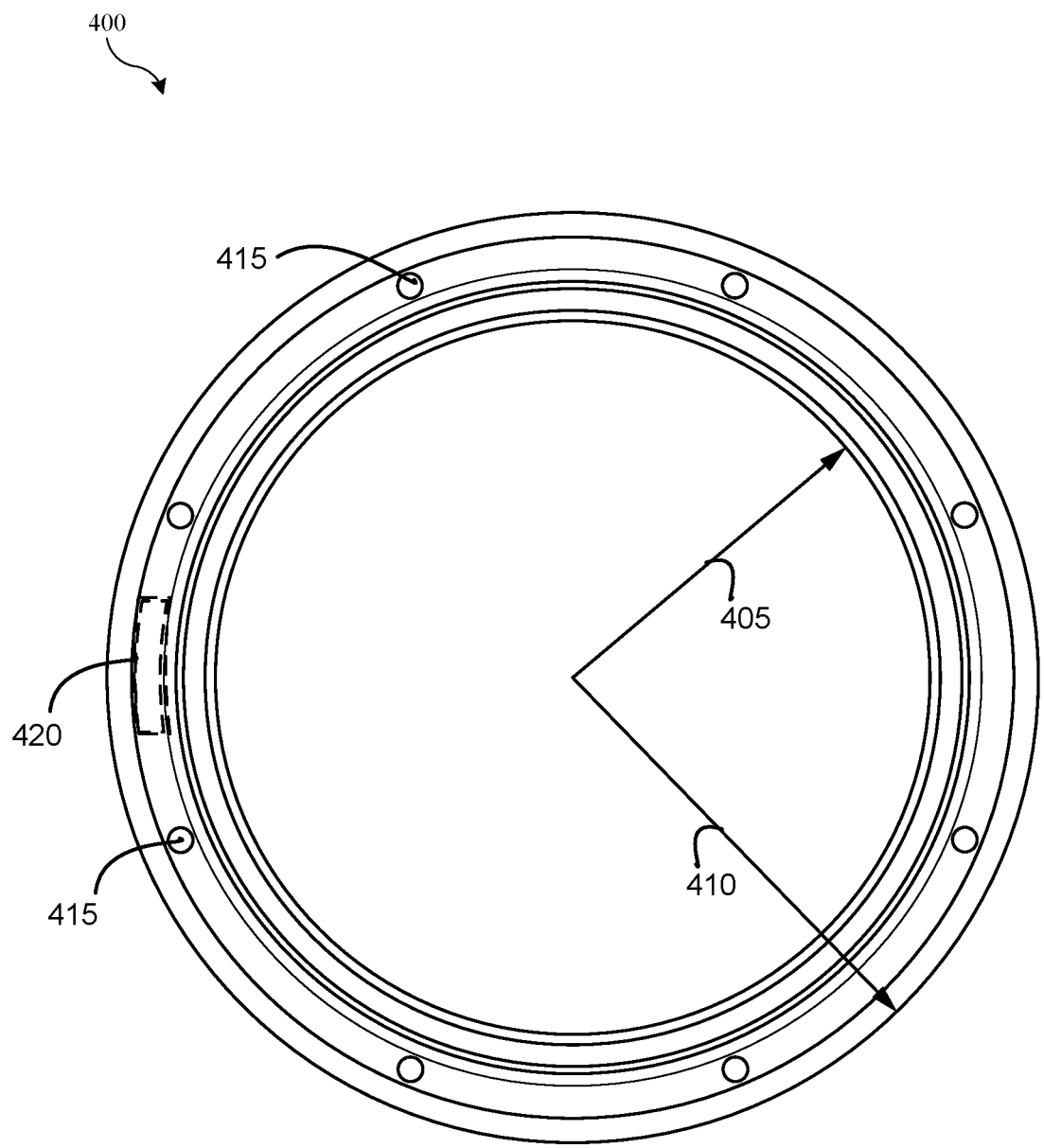
FIG. 4 illustrates a top view of an exemplary pumping liner, according to some embodiments of the present technology.

FIG. 4 illustrates a top view of an exemplary pumping liner 400, according to some embodiments of the present technology. Pumping liner 400 may be pumping liner 300 and may illustrate further details relating to components in system 200 and pumping liner 300. Pumping liner 400 is understood to include any feature or aspect of pumping liner 300, and may be incorporated with processing chambers including any component of system discussed previously in some embodiments. The pumping liner 400 may be incorporated in chambers used to perform semiconductor processing operations including removal of gases and other byproducts from the processing chamber as previously described, including during deposition, removal, and cleaning operations.

As noted, pumping liner 400 may be included in any number of processing chambers, including system 200 described above. Pumping liner 400 may be included as part of the pumping liner assembly 227. For example, the pumping liner 400 may include exhaust ports 231 (e.g., apertures 325) for allowing the flow of gases from the processing region 220 into the pumping cavity 225 (e.g., plenum 330). The components may include any of the features described previously for similar components, as well as a variety of other modifications similarly encompassed by the present technology.

The pumping liner 400 may be an annular member, as shown. The inner wall (e.g., inner wall 315) may define an inner annular radius 405 and the outer wall (e.g., outer wall 320) may define an outer annular radius 410. The inner annular radius 405 may define an area of the processing region. A plenum (e.g., plenum 330) is defined by the space between the inner surface of the inner wall and the inner surface of the outer wall. The plenum may include a divider (e.g., divider 335) that may define a plurality of interior apertures 415, shown in hidden view through an upper surface of the liner. The interior apertures 415 may be distributed circumferentially along the divider. The interior apertures 415 may provide fluid access between a first plenum chamber (e.g., first plenum chamber 340) and a second plenum chamber (e.g., second plenum chamber 345). The interior apertures 415 may be disposed perpendicularly with respect to the pumping apertures (e.g., apertures 325) on the inner wall that provide fluid access between the processing region and the first plenum chamber. While eight interior apertures 415 are depicted in FIG. 4, there may be any number of interior apertures 415 defined in pumping liners according to the present technology. In some embodiments, the interior apertures 415 may be disposed equidistantly from each other along the divider, although the apertures may be spaced apart at differing intervals to adjust flow within the pumping liner or between the plenums. Apertures 415 may be equally sized, or may be characterized by different diameters at different regions of the liner, such as larger diameter further from an exhaust port and smaller diameter nearer the exhaust port, for example, as will be discussed below. Apertures 415 may be characterized by any diameter, and may be characterized by a diameter of less than or about 20 mm, less than or about 15 mm, less than or about 10 mm, less than or about 7 mm, less than or about 5 mm, or less.

Including apertures of different sizes may be used to adjust wafer profile skew as noted previously. For example, apertures 415 may be characterized by a pattern of sizes to create an increase flow through a particular section of the pumping liner. This may draw precursors towards this region, which may, for example, cause deposition or etching operations to occur more readily on a substrate towards this section of the substrate. Some processes may be characterized by a profile skew on the wafer, such as increased and decreased deposition or etching in one location relative to other locations. For example, deposition may occur to a lesser degree near an opening within a chamber where the substrate is delivered and removed. This may be caused by a lower chamber temperature in this region due to non-uniformity of the sidewall profile. By rotating the aperture profile, such as by rotating first structural component 350 in which the apertures 415 may be defined, increased deposition may be caused in this region by aligning larger holes of the pumping liner near this region of the chamber. This may counter the reduced deposition. Any number of other chamber or process planar skews may be accommodated in this way. The first structural component may be inscribed with a scale that may indicate rotation information for adjusting flow profiles within the chamber.

In some embodiments, the interior apertures 415 may be sized such that the pumping apertures (e.g., apertures 325) are characterized by a diameter that is less than the diameter of the interior apertures 415. For example, the diameter of the pumping apertures may be less than or about 90% of the diameter of the interior apertures 415, and may be characterized by a diameter of less than or about 80% of the diameter of apertures 415, less than or about 70% of the diameter, less than or about 60% of the diameter, less than or about 50% of the diameter, less than or about 40% of the diameter, less than or about 30% of the diameter, less than or about 20% of the diameter, or less. In some embodiments, the interior apertures 415 are not equally sized. For example, in some embodiments, an interior aperture 415 may have a larger diameter than the diameter of an interior aperture 415 that, for example, is closer to the main exhaust aperture 420. In some embodiments, the angular offset between interior apertures 415 may vary. Accordingly, in some embodiments, the interior apertures 415 may not be spaced equidistantly about the divider. In some embodiments, the interior apertures 415 are distributed in other patterns and may have sizes, shapes, and distancing from each other that promote uniform or otherwise controlled flow within the processing region 220.

The pumping liner 400 may include a second wall (e.g., second wall 310) that defines a main exhaust aperture 420, shown in hidden view as at the opposite surface or bottom of the liner. The main exhaust aperture 420 may be coupled with a pumping system (e.g., pumping system 264). The main exhaust aperture 420 may provide fluid access between the second plenum chamber (e.g., second plenum chamber 345) and the pumping system. The main exhaust aperture 420 may be vertically offset from the interior apertures 415. For example, the main exhaust aperture 420 may be disposed such that it does not vertically align with any one of interior apertures 415. In some embodiments, the main exhaust aperture 420 is centered between two interior apertures 415.

Use of the plenum divider (e.g., divider 335) may substantially balance or equalize the flow pattern of gases and byproducts in the processing region through the pumping apertures (e.g., apertures 325). The number, positioning, and sizing of the interior apertures (e.g., interior apertures 415) and the pumping apertures (e.g., apertures 325) may impact the flow of gases and byproducts from the processing region through the pumping apertures into the first plenum chamber (e.g., first plenum chamber 340) through interior apertures into the second plenum chamber (e.g., second plenum chamber 345) and out the main exhaust aperture (e.g., main exhaust aperture 420) to be expelled by the pumping system. In other words, modifying the number, size, and/or position of the pumping apertures and/or the number, size, and/or position of the interior apertures may impact how uniformly the gases and byproducts flow from the processing chamber through the pumping apertures and/or the interior apertures. For example, because the pumping system may exhaust gases and byproducts through the pumping liner from a single main exhaust aperture, having fewer interior apertures and/or smaller interior apertures near the main exhaust aperture may promote a more even flow pattern of gases from the first plenum chamber to the second plenum chamber. Thus, such a configuration may promote a more even flow pattern of gases in the processing region through the pumping apertures into the first plenum chamber, which may improve process uniformity on wafer.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a," "an," and "the" include plural references unless the context clearly dictates otherwise. Thus, for example, reference to "an aperture" includes a plurality of such apertures, and reference to "the component" includes reference to one or more components and equivalents thereof known to those skilled in the art, and so forth.

Also, the words "comprise(s)," "comprising," "contain(s)," "containing," "include(s)," and "including," when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing chamber pumping liner, comprising:
   an annular housing, characterized by:
   a first surface;
   a second surface opposite the first surface, wherein the second surface defines a main exhaust aperture;
   an inner wall extending between the first surface and the second surface, the inner wall defining an inner surface of the annular housing, wherein the inner wall defines a plurality of pumping apertures through the inner wall and disposed along the inner wall of the annular housing;
   a first plenum chamber formed along an inner surface of the inner wall;
   a second plenum chamber formed along an inner surface of a lower wall of the annular housing; and
   a plenum barrier separating the first plenum chamber and the second plenum chamber, wherein:
   the plenum barrier defines a plurality of interior apertures through the plenum barrier providing fluid access between the first plenum chamber and the second plenum chamber; and
   a central axis of each of the plurality of interior apertures is perpendicular to a plane that is parallel to the first surface and the second surface and that extends through each of the plurality of pumping apertures.

2. The semiconductor processing chamber pumping liner of claim 1, wherein each of the plurality of pumping apertures are equally-sized and disposed equidistantly along the inner wall of the annular housing.

3. The semiconductor processing chamber pumping liner of claim 1, wherein the main exhaust aperture is vertically offset from each aperture of the plurality of interior apertures.

4. The semiconductor processing chamber pumping liner of claim 1, wherein the plurality of interior apertures are equally-sized and disposed equidistantly about the plenum barrier.

5. The semiconductor processing chamber pumping liner of claim 1, wherein a first aperture of the plurality of interior apertures is larger than a second aperture of the plurality of interior apertures, and wherein an angular offset between apertures of the plurality of interior apertures varies between apertures of the plurality of interior apertures.

6. The semiconductor processing chamber pumping liner of claim 1, wherein a diameter of the plurality of pumping apertures is less than or about one half a diameter of the plurality of interior apertures.

7. The semiconductor processing chamber pumping liner of claim 1, wherein the annular housing comprises a first structural component including the plenum barrier, a second structural component comprising the second surface, and a third structural component comprising the inner wall, wherein the third structural component is seated on a recessed ledge of the first structural component.

8. A semiconductor processing system, comprising:
   a pumping system; and
   a chamber body defining a processing region, wherein:
   the chamber body comprises a pumping liner extending about the processing region along a sidewall of the chamber body;
   the pumping liner comprises an annular member characterized by a first wall and a second wall opposite the first wall;
   the second wall defines a main exhaust aperture extending through the second wall and fluidly coupling the pumping system with the chamber body;
   the annular member is characterized by an inner wall defining an inner annular radius of the annular member along an exterior surface of the inner wall and the inner wall defines a first plurality of apertures distributed circumferentially along the inner wall of the annular member;
   the annular member is characterized by an outer wall defining an outer annular radius of the annular member along an exterior surface of the outer wall;
   a plenum is defined in the annular member between interior surfaces of the first wall, the second wall, the inner wall, and the outer wall;
   the annular member is characterized by a divider disposed within the plenum and extending from the outer wall to the second wall;
   the divider separates the plenum into a first plenum chamber and a second plenum chamber, the first plenum chamber at least partially defined by interior surfaces of the inner wall and the first wall;
   the first plenum chamber is fluidly accessible from the first plurality of apertures defined through the inner wall;
   the divider defines at least one aperture providing fluid access between the first plenum chamber and the second plenum chamber; and
   a central axis of the at least one aperture is perpendicular to a plane that is parallel to the first wall and the second wall and that extends through each of the first plurality of apertures.

9. The semiconductor processing system of claim 8, wherein the first plurality of apertures distributed circumferentially along the inner wall of the annular member are equally sized and distributed equidistantly along the inner wall.

10. The semiconductor processing system of claim 8, wherein the main exhaust aperture is vertically offset from the at least one aperture providing fluid access between the first plenum chamber and the second plenum chamber.

11. The semiconductor processing system of claim 8, wherein the at least one aperture providing fluid access between the first plenum chamber and the second plenum chamber comprises a second plurality of apertures that are equally-sized and disposed equidistantly about the divider.

12. The semiconductor processing system of claim 8, wherein the at least one aperture providing fluid access between the first plenum chamber and the second plenum chamber is a second plurality of apertures, wherein a first aperture of the second plurality of apertures is larger than a second aperture of the second plurality of apertures, and wherein an angular offset between apertures of the plurality of apertures varies between apertures of the plurality of apertures.

13. The semiconductor processing system of claim 8, wherein the first plurality of apertures distributed circumferentially along the inner wall of the annular member are characterized by a diameter of less than or about 80% of the diameter of the at least one aperture providing fluid access between the first plenum chamber and the second plenum chamber.

14. The semiconductor processing system of claim 8, wherein the annular member comprises a first structural component including the divider, a second structural component comprising the second wall, and a third structural component comprising the inner wall, wherein the third structural component is seated on a recessed ledge of the first structural component.

15. A semiconductor processing chamber pumping liner, comprising:
   an annular member characterized by:
      a first wall,
      a second wall opposite the first wall, wherein the second wall defines a main exhaust aperture extending through the second wall,
      an inner wall defining an inner annular radius of the annular member along an exterior surface of the inner wall, wherein the inner wall defines a first plurality of apertures distributed circumferentially along the inner wall of the annular member,
      an outer wall defining an outer annular radius of the annular member along an exterior surface of the outer wall, wherein a plenum is defined in the annular member between interior surfaces of the first wall, the second wall, the inner wall, and the outer wall, and
      a divider disposed within the plenum and extending from the outer wall to the second wall, wherein:
         the divider separates the plenum into a first plenum chamber and a second plenum chamber, the first plenum chamber at least partially defined by interior surfaces of the inner wall and the first wall;
         the first plenum chamber is fluidly accessible from the plurality of apertures defined through the inner wall;
         the divider defines at least one aperture providing fluid access between the first plenum chamber and the second plenum chamber; and
         a central axis of the at least one aperture is perpendicular to a plane that is parallel to the first wall and the second wall and that extends through each of the first plurality of apertures.

16. The semiconductor processing chamber pumping liner of claim 15, wherein the main exhaust aperture is vertically offset from the at least one aperture providing fluid access between the first plenum chamber and the second plenum chamber.

17. The semiconductor processing chamber pumping liner of claim 15, wherein the at least one aperture providing fluid access between the first plenum chamber and the second plenum chamber comprises a second plurality of apertures that are equally-sized and disposed equidistantly about the divider.

18. The semiconductor processing chamber pumping liner of claim 15, wherein the at least one aperture providing fluid access between the first plenum chamber and the second plenum chamber is a second plurality of apertures, wherein a first aperture of the second plurality of apertures is larger than a second aperture of the second plurality of apertures, and wherein an angular offset between apertures of the second plurality of apertures varies between apertures of the second plurality of apertures.

19. The semiconductor processing chamber pumping liner of claim 15, wherein a diameter of the first plurality of apertures distributed circumferentially along the inner wall of the annular member is less than or about one half a diameter of the at least one aperture providing fluid access between the first plenum chamber and the second plenum chamber.

20. The semiconductor processing chamber pumping liner of claim 15, wherein the annular member comprises a first structural component comprising the divider, a second structural component comprising the second wall, and a third structural component comprising the inner wall, wherein the third structural component is seated on a recessed ledge of the first structural component.

* * * * *